United States Patent
Ishida et al.

(10) Patent No.: US 8,541,695 B2
(45) Date of Patent: Sep. 24, 2013

(54) WIRING BOARD AND METHOD FOR MANUFACTURING THE SAME

(75) Inventors: Atsushi Ishida, Ogaki (JP); Ryojiro Tominaga, Ogaki (JP); Kenji Sakai, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 180 days.

(21) Appl. No.: 12/956,826

(22) Filed: Nov. 30, 2010

(65) Prior Publication Data

US 2011/0209911 A1  Sep. 1, 2011

Related U.S. Application Data

(60) Provisional application No. 61/308,579, filed on Feb. 26, 2010.

(51) Int. Cl.
*H05K 1/11* (2006.01)
(52) U.S. Cl.
USPC .............................. 174/264; 174/260; 174/262
(58) Field of Classification Search
None
See application file for complete search history.

(56) References Cited

U.S. PATENT DOCUMENTS

| 5,421,083 A * | 6/1995 | Suppelsa et al. ................ 29/852 |
| 8,227,706 B2 * | 7/2012 | Roy et al. ....................... 174/262 |
| 2009/0200682 A1 * | 8/2009 | Zhang ........................... 257/774 |

FOREIGN PATENT DOCUMENTS

JP  2002-204075  7/2002

OTHER PUBLICATIONS

U.S. Appl. No. 12/857,838, filed Aug. 17, 2010, Ishida, et al.
U.S. Appl. No. 12/956,753, filed Nov. 30, 2010, Morita, et al.
U.S. Appl. No. 12/952,864, filed Nov. 23, 2010, Ishida, et al.

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

A wiring board includes a substrate having first and second surfaces, a first penetrating hole penetrating through the substrate, a first through-hole conductor formed on the inner wall of the first hole, a filler filled inside the first conductor and forming a second penetrating hole, and a second through-hole conductor formed in the second hole, a first conductive circuit on the first surface of the substrate, a second conductive circuit on the second surface of the substrate, a first conductive portion on one end of the second hole, and a second conductive portion on the opposite end of the second penetrating hole. The first conductor is connecting the first circuit and the second circuit. The second conductor is made of a conductive material filled in the second hole and is connecting the first conductive portion and the second conductive portion.

12 Claims, 14 Drawing Sheets

Thickness (t1) (um) of first conductive circuit (24a) > Thickness (t2) (um) of first conductor portion 28
Thickness (t3) (um) of second conductive circuit (24b) > Thickness (t4) (um) of second conductor portion 34

200a: Electroless plated film
200b: Electrolytic plated film
200c: Electroless plated film
200d: Electrolytic plated film

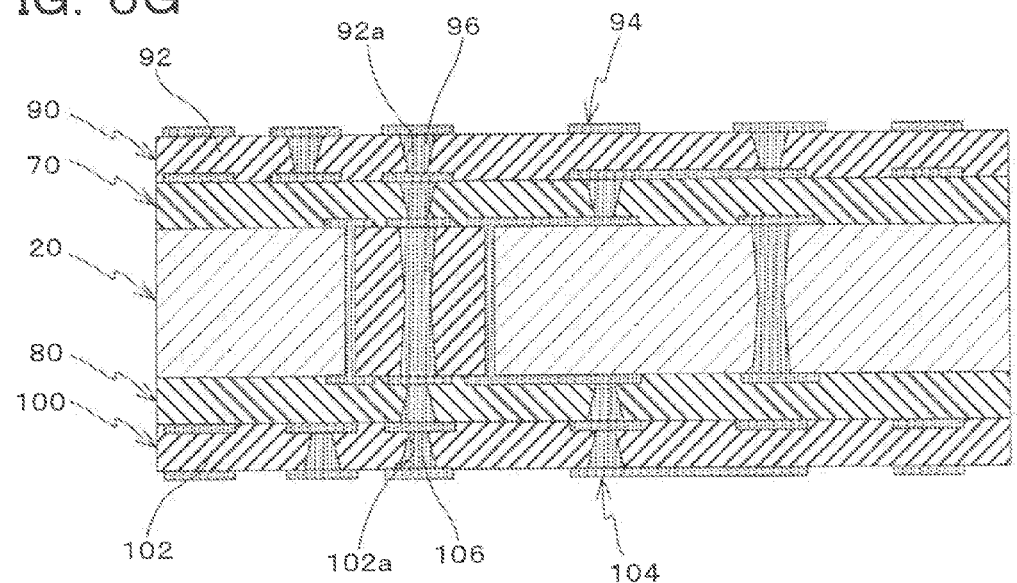
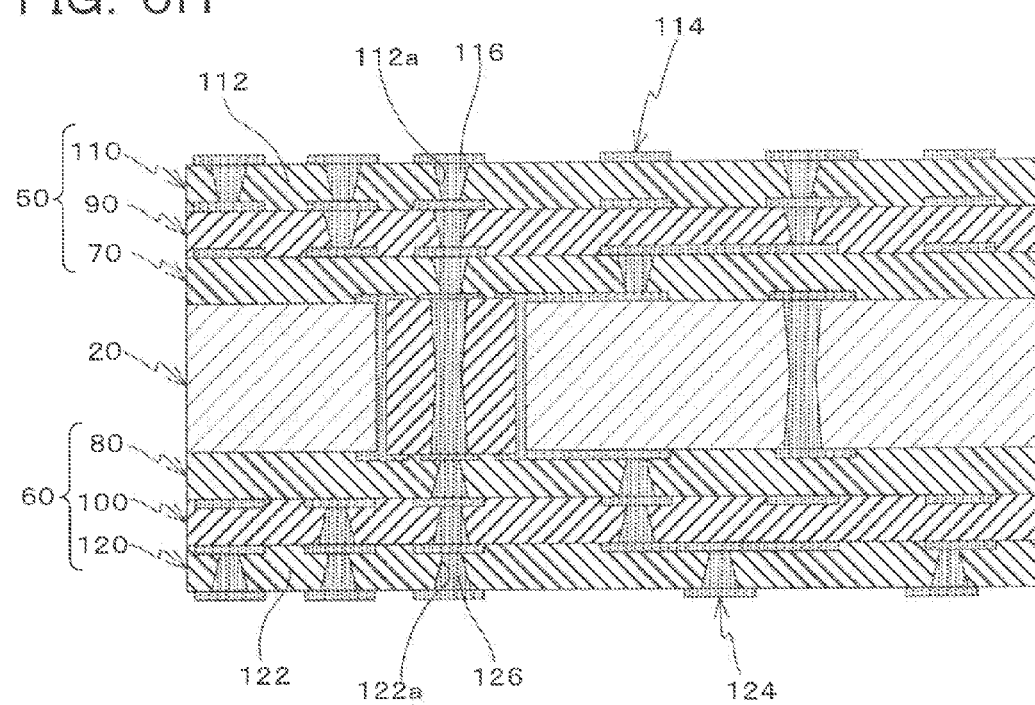

WIRING BOARD AND METHOD FOR MANUFACTURING THE SAME

CROSS-REFERENCE TO RELATED APPLICATIONS

The present application claims the benefits of priority to U.S. Application No. 61/308,579, filed Feb. 26, 2010. The contents of that application are incorporated herein by reference in their entirety

BACKGROUND OF THE INVENTION

1. Field of the Invention

The present invention relates to a wiring board and its manufacturing method.

2. Discussion of the Background

In recent years, as various semiconductor elements have become highly integrated and have even more pins, printed wiring boards that have finer wiring are being required. In addition, since analog signals and digital-pulse signals are used in electronic devices in which printed wiring boards are used, arrangements similar to those for alternating-current signals are required. In such a multilayer printed wiring board, when alternating-current signals flow, impedance (inductance) rises in a through-hole conductor to be used as a power supply line to a CPU. Accordingly, if a sudden demand for power comes from the CPU, the supply of voltage may be delayed and thus may pose an obstacle to the operation of the CPU.

In Japanese Laid-Open Patent Publication No. 2002-204075, a printed wiring board is described where without using chip capacitors, through holes with a coaxial structure are used. The contents of Japanese Laid-Open Patent Application No. 2002-204075 are incorporated herein by reference in their entirety in the present application.

SUMMARY OF THE INVENTION

According to one aspect of the present invention, a wiring board includes a substrate having a first surface and a second surface on the opposite side of the first surface, the substrate having a first penetrating hole penetrating through the substrate between the first surface and the second surface, a first through-hole conductor formed on the inner wall of the first penetrating hole, a filler filled inside the first through-hole conductor and forming a second penetrating hole, and a second through-hole conductor formed in the second penetrating hole, a first conductive circuit formed on the first surface of the substrate, a second conductive circuit formed on the second surface of the substrate, a first conductive portion formed on one end of the second penetrating hole, and a second conductive portion formed on the opposite end of the second penetrating hole. The first through-hole conductor is connecting the first conductive circuit and the second conductive circuit. The second through-hole conductor includes a conductive material filled in the second penetrating hole and is connecting the first conductive portion and the second conductive portion.

According to another aspect of the present invention, a method for manufacturing a wiring board includes forming a first penetrating hole in a substrate such that the first penetrating hole penetrates through the substrate between a first surface of the substrate and a second surface of the substrate on the opposite side of the first surface, forming a first through-hole conductor on the inner wall of the first penetrating hole of the substrate, filling a filler inside the first through-hole conductor, forming a second penetrating hole in the filler, forming a second through-hole conductor by filling a conductive material in the second penetrating hole, forming a first conductive circuit on the first surface of the substrate, forming a second conductive circuit on the second surface of the substrate such that the second conductive circuit is connected to the first conductive circuit by the first through-hole conductor, forming a first conductive portion on one end of the second penetrating hole, and forming a second conductive portion on the opposite end of the second penetrating hole such that the second conductive portion is connected to the first conductive portion by the second through-hole conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 6A-6H are views showing steps for forming built-up layers following the steps for forming a core substrate shown in FIGS. 5A-5J;

DETAILED DESCRIPTION OF THE EMBODIMENTS

Figure 1:
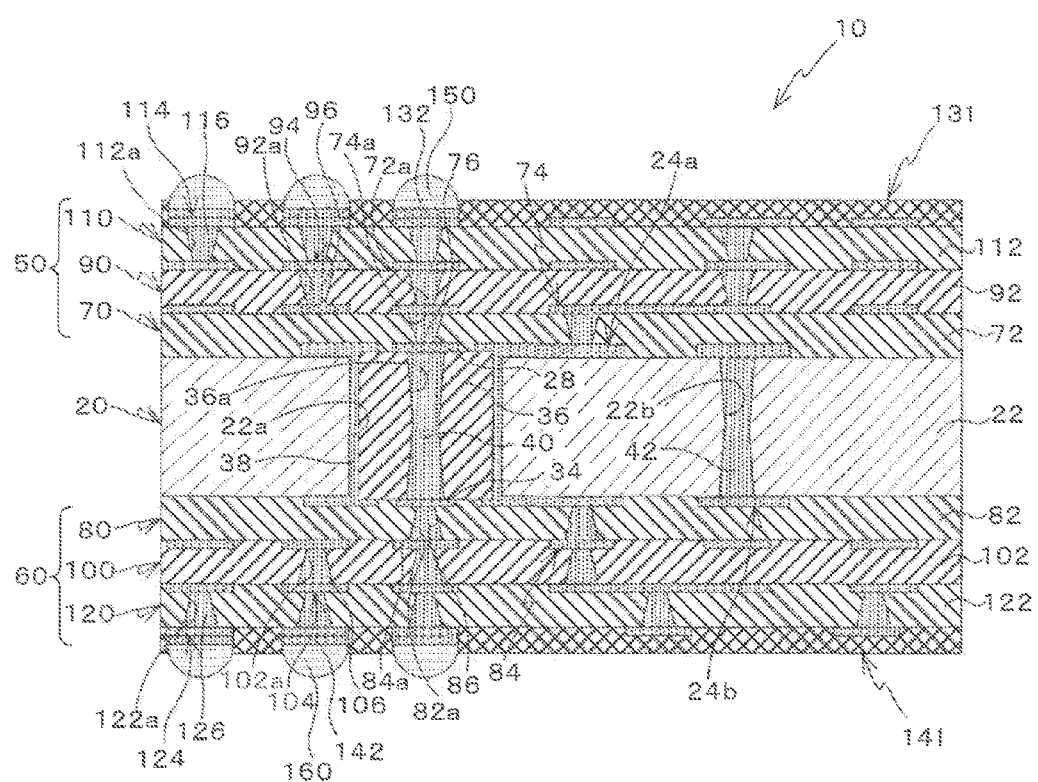
FIG. 1 is a cross-sectional view showing a wiring board according to an embodiment of the present invention.

The embodiments will now be described with reference to the accompanying drawings, wherein like reference numerals designate corresponding or identical elements throughout the various drawings.

Wiring board 10 according to the present embodiment is a printed wiring board. As shown in FIG. 1, wiring board 10 has core substrate 20, built-up layers (50, 60), solder-resist layers (131, 141) and external connection terminals (150, 160) made of solder.

Core substrate 20 has insulative substrate 22, first conductive circuit (24a) and second conductive circuit (24b) made of copper, for example, outer through-hole conductor 38, inner through-hole conductor 40 and filler 36. First conductive circuit (24a) is formed on the first surface of core substrate 20 (insulative substrate 22), and second conductive circuit (24b) is formed on the second surface of core substrate 20 (insulative substrate 22).

Insulative substrate 22 is made of epoxy resin, for example. Epoxy resin is preferred to contain reinforcing material such as glass fiber (glass fabric or glass non-woven fabric, for example) or aramid fiber (aramid non-woven fabric, for example) impregnated with resin. Any type of material may be used for insulative substrate 22. The reinforcing material has a smaller thermal expansion coefficient than the primary material (epoxy resin in the present embodiment).

In insulative substrate 22, first penetrating hole (22a) is formed to penetrate from the first surface of core substrate 20 through the second surface. The opening shape of first penetrating hole (22a) is circular, for example.

On the inner wall of first penetrating hole (22a), ring-shaped outer through-hole conductor 38 is formed by plating. Here, plating indicates both depositing a layered conductor (such as metal) on a surface of metal or resin and such a deposited conductive layer (such as a metal layer). Also, plating includes wet plating such as electrolytic plating and electroless plating along with dry plating such as PVD (Physical Vapor Deposition) and CVD (Chemical Vapor Deposition). From a viewpoint of lowering electrical resistance, outer through-hole conductor 38 is preferred to be made of copper plating.

First conductive circuit (24a) and second conductive circuit (24b) are connected by outer through-hole conductor 38.

Filler 36 is filled inside outer through-hole conductor 38. Filler 36 is made of thermosetting resin such as epoxy resin. As for the preferred resin to be used for filler 36, at least one kind may be selected from among bisphenol-type epoxy resins and novolac-type epoxy resins. In filler 36, second penetrating hole (36a) is formed to penetrate from the first surface of core substrate 20 through the second surface. The opening shape of second penetrating hole (36a) is circular, for example.

Inner through-hole conductor 40 is formed with the plating filled in second penetrating hole (36a). Inner through-hole conductor 40 is preferred to have narrowed portion (40a) (a portion with the smallest diameter) formed at substantially the halfway point in the thickness of insulative substrate 22 (see FIG. 2), where the diameter of the central portion is set smaller than the diameters of the upper and lower portions. The upper and lower portions are formed substantially symmetrical with narrowed portion (40a) as a divide. However, inner through-hole conductor 40 is not limited to such, and it may be formed to be asymmetrical with narrowed portion (40a) as a divide. Here, the central axis of inner through-hole conductor 40 overlaps the central axis of first penetrating hole (22a). However, inner through-hole conductor 40 is not limited to such, and it may be formed in a position shifted in a direction parallel to the surface of insulative substrate 22. Here, from a viewpoint of lowering electrical resistance, inner through-hole conductor 40 is preferred to be made of copper plating.

In inner through-hole conductor 40, lid-shaped first conductive portion 28 and second conductive portion 34 are formed so as to cover its upper and lower surfaces. Namely, conductive portions (28, 34) work as lands. First conductive portion 28 and second conductive portion 34 are made of plating. First conductive portion 28 and second conductive portion 34 are positioned to face each other by sandwiching filler 36. First conductive portion 28 and second conductive portion 34 are positioned on substantially the same planes as first conductive circuit (24a) and second conductive circuit (24b) respectively (first surface and second surface of core substrate 20). The surface of first conductive portion 28 is positioned on substantially the same plane as the surface of first conductive circuit (24a), and the surface of second conductive portion 34 is positioned on substantially the same plane as the surface of second conductive circuit (24b).

First conductive portion 28 and second conductive portion 34 are connected by inner through-hole conductor 40. As described so far, since first conductive portion 28 and second conductive portion 34 formed on the upper and lower surfaces of core substrate 20 are connected by inner through-hole conductor 40, the aspect ratio (depth/diameter) of first penetrating hole (22a) is set small, compared with those in printed wiring boards described in the background art. Accordingly, when forming inner through-hole conductor 40 by plating, improved results in filling are achieved. Namely, defects such as voids do not occur in inner through-hole conductor 40, and reliability is enhanced in the coaxial through-hole conductors, leading to higher reliability of the wiring board. If such inner through-hole conductor 40 is used as a power-supply through-hole conductor to be connected to the power-supply line for a CPU, electrical resistance is suppressed from rising and variations in the voltage supplied for the CPU are minimized.

In the present embodiment, a coaxial through-hole structure is formed with outer through-hole conductor 38 and inner through-hole conductor 40 as shown in FIG. 1.

Figure 2:
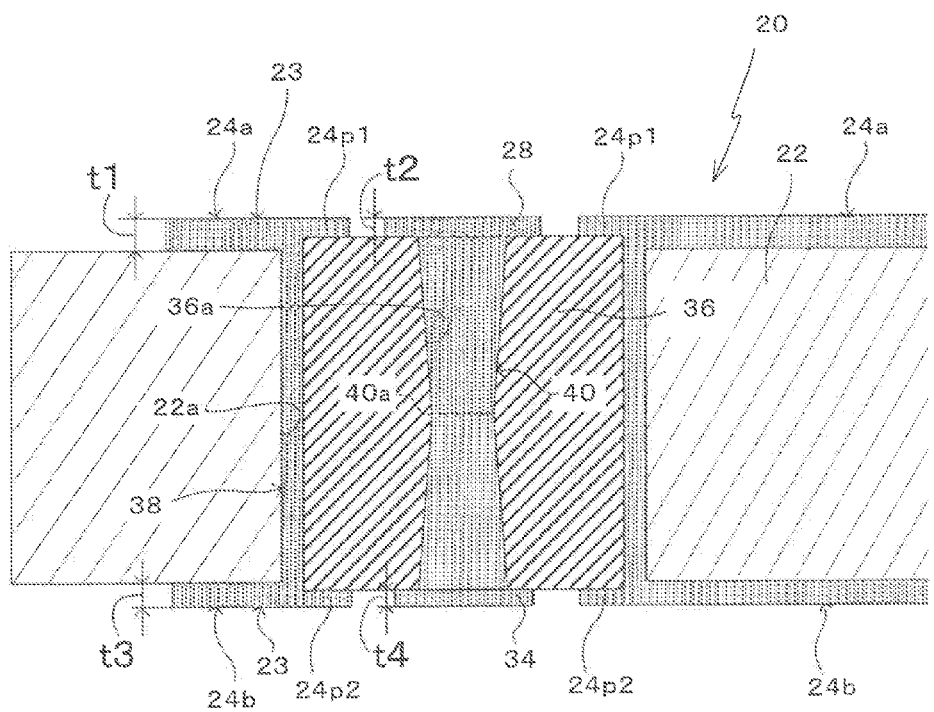
FIG. 2 is a magnified cross-sectional view showing a through hole in a core substrate.

As shown in FIG. 2, first conductive circuit (24a) and second conductive circuit (24b) each have land portion 23 formed at an open end of outer through-hole conductor 38 and a wiring portion extended from land portion 23. As shown in FIG. 2, in wiring board 10 of the present embodiment, first conductive circuit (24a) (land portion 23) and second conductive circuit (24b) (land portion 23) each protrude from the periphery of first penetrating hole (22a) toward second penetrating hole (36a) (inner through-hole conductor 40). Specifically, in first conductive circuit (24a) (land portion 23), first protruding portion (24p1) is formed to protrude toward the center of first penetrating hole (22a) along the first surface of core substrate 20. Also, in second conductive circuit (24b) (land portion 23), second protruding portion (24p2) is formed to protrude toward the center of first penetrating hole (22a) along the second surface of core substrate 20.

First protruding portion (24p1) and second protruding portion (24p2) are each formed to be a circular ring, and face each other by sandwiching filler 36. In other words, first protruding portion (24p1) and second protruding portion (24p2) are formed as an overhang which protrudes inward from outer through-hole conductor 38. In addition, first protruding portion (24p1) and second protruding portion (24p2) are in contact with the upper and lower surfaces of filler 36, holding filler 36 from above and below. Resin-made filler 36 is suppressed from thermal expansion because of first protruding portion (24p1) and second protruding portion (24p2), and the reliability of wiring board 10 is enhanced.

Also, as shown in FIG. 2, thickness (t1) (um) of first conductive circuit (24a) (land portion 23) is set greater than thickness (t2) (um) of first conductive portion 28. Also, thickness (t3) (urn) of second conductive circuit (24b) (land portion 23) is set greater than thickness (t4) (urn) of second conductive portion 34.

Figure 4:
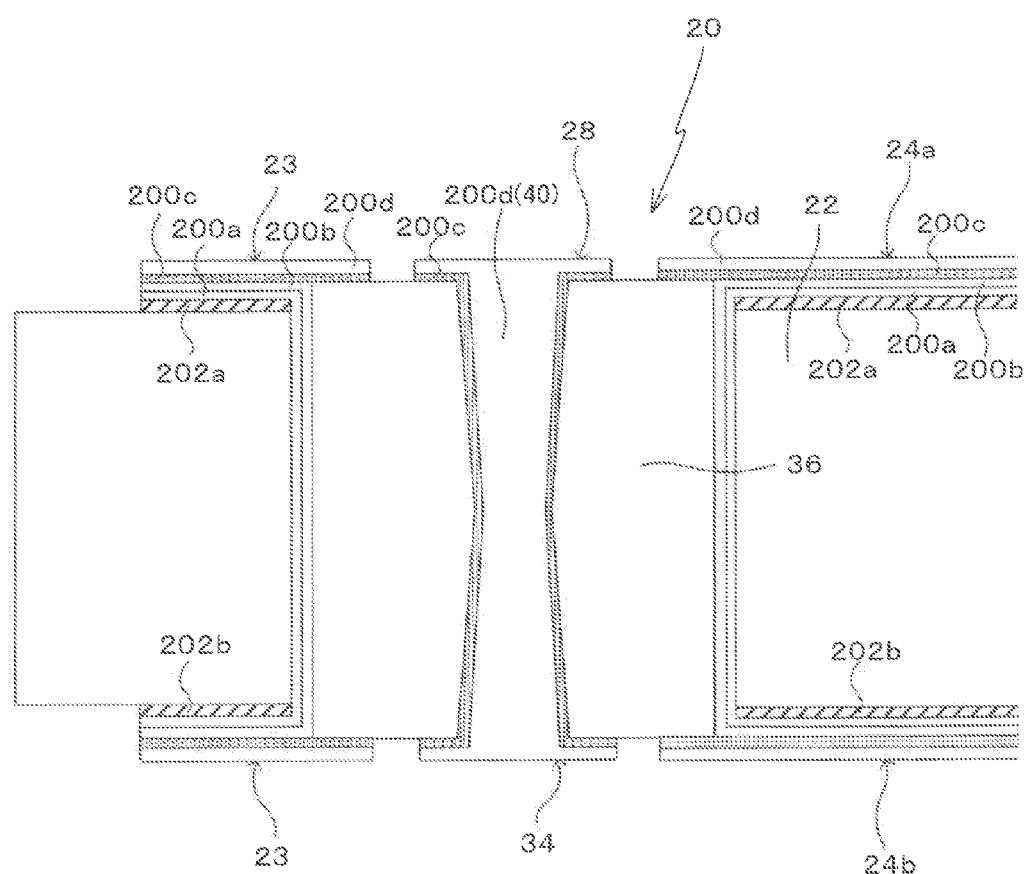
FIG. 4 is a magnified cross-sectional view schematically showing a through hole in the core substrate.

As shown in FIG. 4, on the substrate surface excluding the top surface of filler 36, first conductive circuit (24a) has a multilayer structure with copper foil (202a) on the insulative substrate along with electroless plated film (200a), electrolytic plated film (200b), electroless plated film (200c) and electrolytic plated film (200d) formed in that order from copper foil (202a) upward. Inner through-hole conductor 40 is formed in the same process using the same material as later-described conductive layers.

In addition, on the top surface of filler 36, first conductive portion 28 is made of electroless plated film (200c) and electrolytic plated film (200d) formed as its upper layer.

Core substrate 20 has the same structures as above in second conductive circuit (24b) and second conductive portion 34. As described, by setting first and second conductive circuits (24a, 24b) thicker than first and second conductive portions (28, 34) respectively, rigidity is ensured in core substrate 20. As a result, for example, even when a thermal history is produced while forming external connection terminals, warping is effectively suppressed from occurring in core substrate 20.

Figure 3:
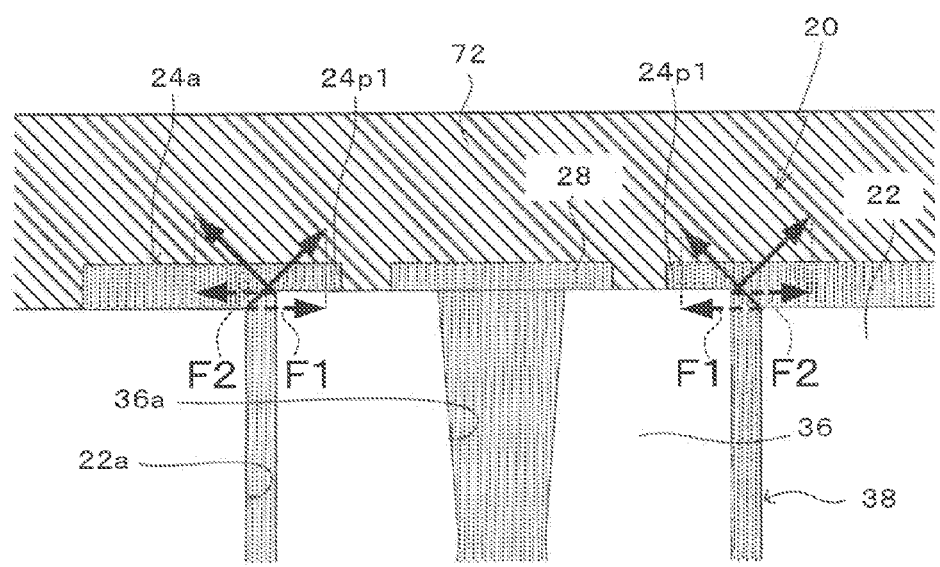
FIG. 3 is a magnified cross-sectional view showing a top portion of the through hole in the core substrate.

As shown in FIG. 3, because of first protruding portion (24p1), the cross-sectional shape of the conductive portion formed by such a protruding portion is formed to be a pair of "T's" positioned to the right and left of filler 36. Accordingly, the thermal stress acting on the conductive portion from filler 36 (component force (F1) in a horizontal direction) becomes equal to the thermal stress acting on the conductive portion from insulative substrate 22 (component force (F2) in a horizontal direction). As a result, the stresses are offset by each other, and the stresses do not concentrate in the angular portions of outer through-hole conductor 38. Thus, cracks originating the angular portions of outer through-hole conductor 38 are prevented from occurring in insulation layer 72 positioned as an upper layer of the conductive portion. Although omitted from being shown in the drawing, the same as in first protruding portion (24p1) applies to second protruding portion (24p2) which is formed on the second surface of core substrate 22 by sandwiching insulative substrate 22.

Furthermore, as previously shown in FIG. 1, core substrate 20 has third through-hole conductor 42 which connects first conductive circuit (24a) and second conductive circuit (24b). Third through-hole conductor 42 is formed by filling plating in third penetrating hole (22b) formed in insulative substrate 22. Third through-hole conductor 42 works as a signal conductor.

Built-up layer 50 is formed on the first surface of core substrate 20, and built-up layer 60 is formed on the second surface of core substrate 20. Built-up layer 50 is formed with first layer 70, second layer 90 and third layer 110 in that order from the core-substrate 20 side. Built-up layer 60 is formed with first layer 80, second layer 100 and third layer 120 in that order from the core-substrate 20 side. First layer 70 has insulation layer 72 and wiring layer 74 which is formed on the upper-side surface of insulation layer 72. First layer 80 has insulation layer 82 and wiring layer 84 which is formed on the lower-side surface of insulation layer 82.

Insulation layer 72 is formed on the first surface of core substrate 20 as shown in FIG. 1. Insulation layer 82 is formed on the second surface of core substrate 20.

Via hole (72a) is formed in insulation layer 72. Also, via hole (82a) is formed in insulation layer 82. Then, plating is filled in via holes (72a, 82a), forming via conductors (76, 86) respectively.

Insulation layers (72, 82) are made of cured prepreg, for example. As for prepreg, the following is used: base material such as glass fiber or aramid fiber impregnated with resin such as epoxy resin, polyester resin, bismaleimide-triazine resin (BT resin), imide resin (polyimide), phenol resin or allyl polyphenylene ether resin (A-PPE resin). Instead of prepreg, liquid- or film-type thermosetting resin or thermoplastic resin, a compound of such resins, or RCF (resin-coated copper foil) may also be used.

In the present embodiment, via conductors (76, 86) are filled vias. However, via conductors (76, 86) are not limited to being such, and they may also be conformal vias.

Wiring layer 74 includes conductor (74a) positioned over inner through-hole conductor 40. Conductor (74a) is connected to first conductive portion 28 by via conductor 76.

Wiring layer 84 includes conductor (84a) positioned below inner through-hole conductor 40. Conductor (84a) is connected to second conductive portion 34 by via conductor 86.

In the present embodiment, via conductor 76 is formed to be positioned substantially along the central axis of inner through-hole conductor 40. However, via conductor 76 is not limited to being positioned in such a manner, and it may be positioned by shifting away from inner through-hole conductor 40 in a direction parallel to the surface of insulative substrate 22.

As shown in FIG. 1, second layer 90 has insulation layer 92 and wiring layer 94 which is formed on the upper-side surface of insulation layer 92. Second layer 100 has insulation layer 102 and wiring layer 104 which is formed on the lower-side surface of insulation layer 102. Also, third layer 110 has insulation layer 112 and wiring layer 114 which is formed on the upper-side surface of insulation layer 112, and third layer 120 has insulation layer 122 and wiring layer 124 which is formed on the lower-side surface of insulation layer 122.

Via holes (92a, 102a) are formed in their respective insulation layers (92, 102). Plating is filled in via holes (92a, 102a), forming via conductors (96, 106) which are filled vias. In addition, on the upper-side surface of insulation layer 92 and on the lower-side surface of insulation layer 102, wiring layer 94 and wiring layer 104 are formed respectively. Wiring layer 74 and wiring layer 94 are connected by via conductor 96, and wiring layer 84 and wiring layer 104 are connected by via conductor 106.

Also, on the upper-side surface of insulation layer 92 and on the lower-side surface of insulation layer 102, insulation layer 112 and insulation layer 122 are formed respectively. Then, wiring layer 94 and wiring layer 114 are connected by via conductor 116 formed in via hole (112a) in insulation layer 112. Also, wiring layer 104 and wiring layer 124 are connected by via conductor 126 formed in via hole (122a) in insulation layer 122.

Then, solder-resist layer 131 is formed on the upper-side surface of insulation layer 112, and solder-resist layer 141 is formed on the lower-side surface of insulation layer 122. Solder-resist layers (131, 141) are made of, for example, photosensitive resin using acrylic epoxy resin, thermosetting resin primarily containing epoxy resin, ultraviolet setting resin or the like.

In solder-resist layers (131, 141), openings partly exposing wiring layer 114 and openings partly exposing wiring layer 124 are formed respectively. Such portions of wiring layer 114 and of wiring layer 124 are used as solder pads. Solder connection layers (132, 142) are respectively formed on solder pads to enhance solderability. Then, external connection terminals (150, 160) are arranged on solder connection layers (132, 142). External connection terminals (150, 160) are used for electrical connection with other wiring boards and electronic components. Outer through-hole conductor 38 and inner through-hole conductor 40 are used to supply power for electronic components such as a CPU (Central Processing Unit) or an MPU (Micro Processing Unit) to be mounted on wiring board 10. Here, the direction of electric current in outer through-hole conductor 38 and the direction of electric current in inner through-hole conductor 40 are set opposite when they are used. Moreover, electronic components such as a VRM (Voltage Regulator Module) to supply constant voltage for the CPU or MPU may also be mounted on wiring board 10 if required.

Next, a method for manufacturing wiring board 10 is described with reference to FIGS. 5-8.

Forming Core Substrate 20

Figure 5A:
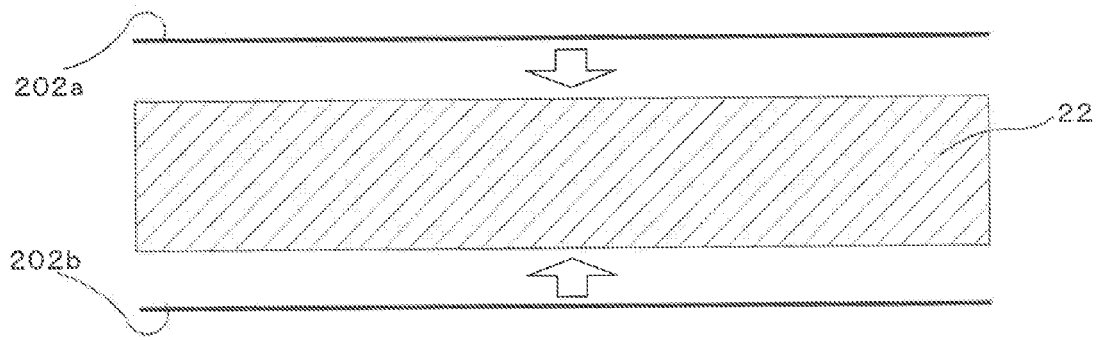
FIGS. 5A-5J are views showing steps for forming a core substrate.

First, copper foils (202a, 202b) are placed on the first surface and second surface of insulative substrate 22 as shown in FIG. 5A, and copper-clad laminate 200 is formed by pressing them.

Figure 5B:
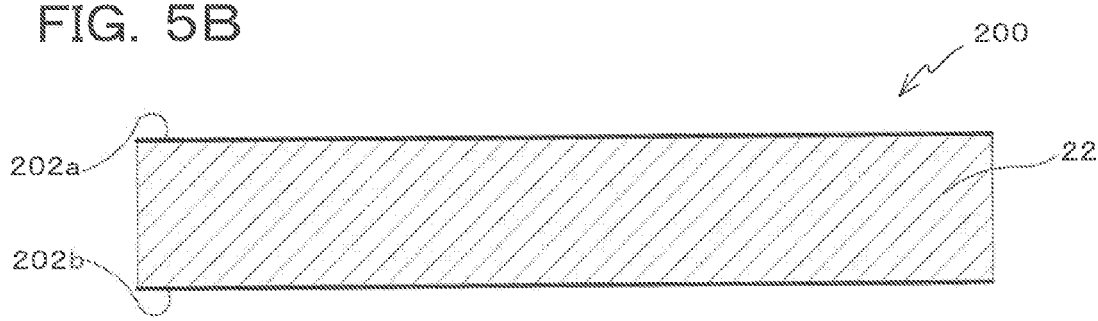
Figure 5C:
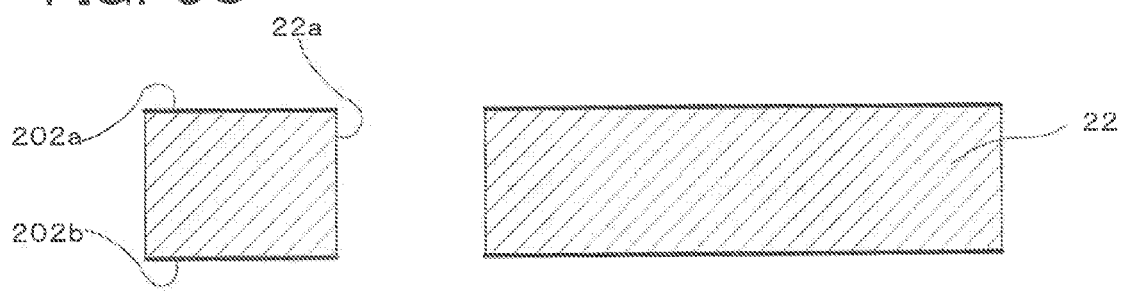

Accordingly, as shown in FIG. 5B, copper-clad laminate 200 is obtained, having insulative substrate 22, copper foil (202a) formed on the first surface of insulative substrate 22 and copper foil (202b) formed on the second surface of insulative substrate 22.

Next, first penetrating hole (22a) is bored in copper-clad laminate 200 by a known boring method using a drill, for example. The opening shape of first penetrating hole (22a) is circular here. However, it is not limited to being such and may be oval, for example.

Then, by performing electroless plating using a catalyst such as palladium, electroless plated films are formed on the surfaces of copper-clad laminate 200 including the inner wall of first penetrating hole (22a).

The electroless plated films are made of copper, for example. However, the material for electroless plated film is not limited to copper, and metals such as nickel, titanium and chrome may also be used. In addition, to form metal films, methods such as PVD (Physical Vapor Deposition) and CVD (Chemical Vapor Deposition) may also be used instead of electroless plating.

Figure 5D:
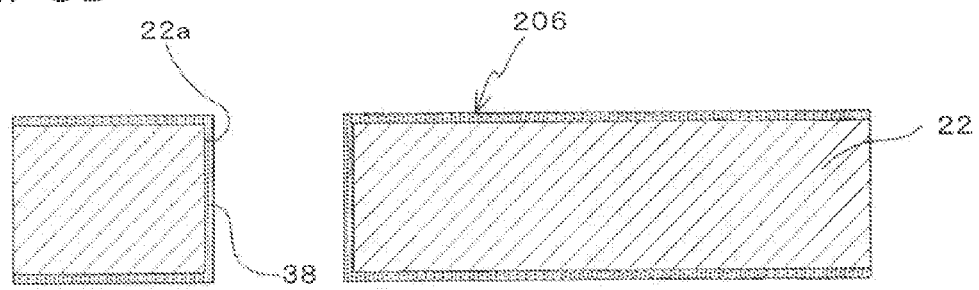

Next, electrolytic plating is performed to form electrolytic plated films 206 made of copper, for example, using the electroless plated films as seed layers, as shown in FIG. 5D. The material for electrolytic plated film 206 is not limited to copper, and nickel, titanium, chrome or the like may also be used.

By the above electroless plating and electrolytic plating, outer through-hole conductor 38 is formed on the inner wall of first penetrating hole (22a) as shown in FIG. 5D.

Figure 5E:
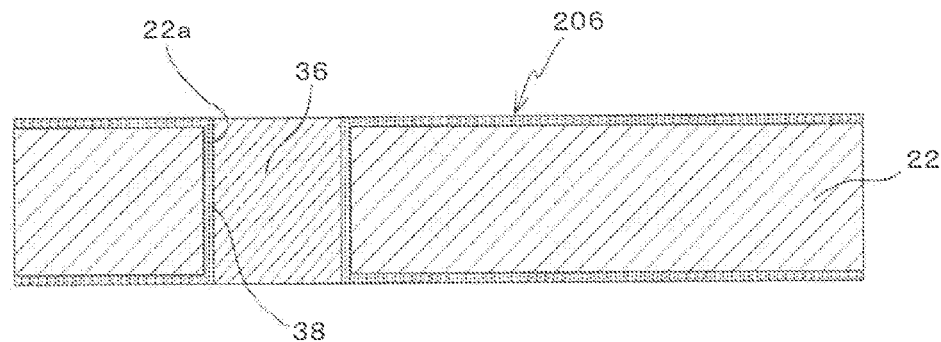

Next, as shown in FIG. 5E, in outer through-hole conductor 38, resin filling material containing thermosetting resin such as epoxy resin and inorganic particles such as silica is filled, and then the filling material is dried and semi-cured. As for a filling method, known methods such as screen printing may be used. Next, the substrate surface is leveled, if required. After that, the resin filling material filled in the hole is heated and cured. Accordingly filler 36 is formed in outer through-hole conductor 38.

Figure 5F:
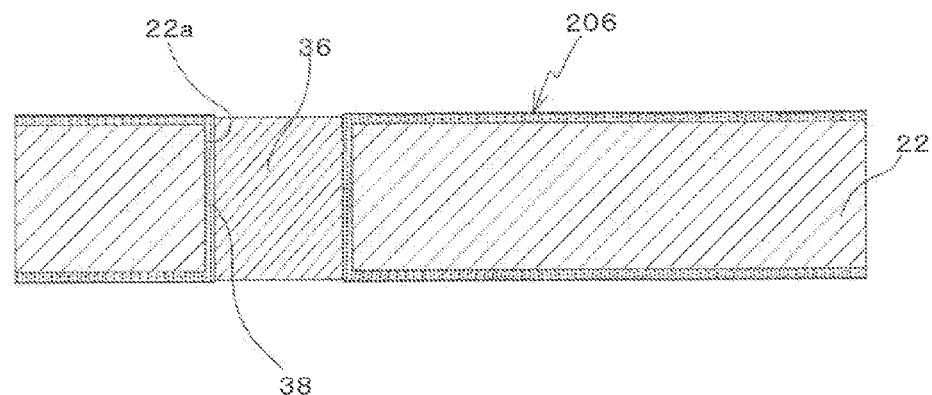

Next, black-oxide treatment is conducted on the surfaces of electrolytic plated films 206 using an oxidation solution, as shown in FIG. 5F. Accordingly, electrolytic plated films 206 become blackened, and their laser absorption rate during laser processing increases.

Figure 5G:
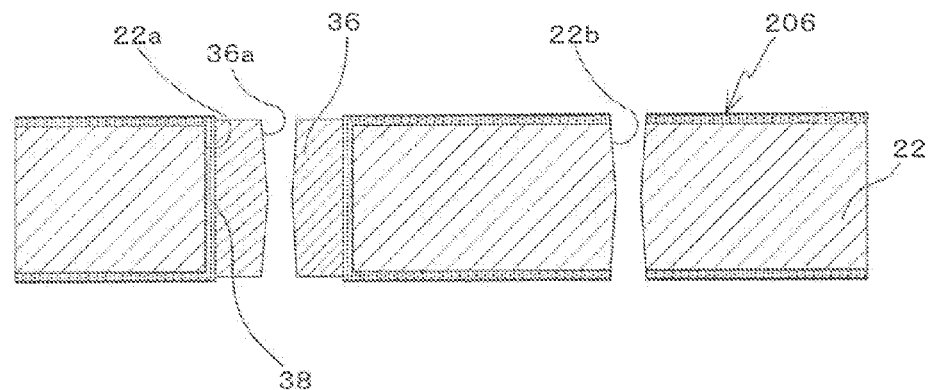

Next, second penetrating hole (36a) and third penetrating hole (22b) are bored by using a laser as shown in FIG. 5G. Here, a carbon-dioxide gas ($CO_2$) laser, a UV-YAG laser or the like, for example, is irradiated at the first and second surfaces of copper-clad laminate 200. In addition, at this point either a laser having higher energy in the center than on the periphery, or a multi-pulse laser is irradiated. When irradiating a multi-pulse laser, it is preferred that laser diameters be made gradually smaller from the first pulse toward the final pulse. Alternatively, a laser having a higher energy density in the center than on the periphery may be used for the final pulse laser. Here, the number of laser irradiations is not limited specifically. Irradiating a laser may be conducted separately on one surface at a time or on both surfaces simultaneously.

Here, second penetrating hole (36a) is formed to have a diameter in the central portion set smaller than the diameters in the upper-surface and lower-surface openings of filler 36. However, second penetrating hole (36a) is not limited to being formed in such a way. For example, it may be formed so that the diameter in the lower-surface opening of filler 36 is set smaller than the diameter in the upper-surface opening. Alternatively, the wall surface of second penetrating hole (36a) may be set perpendicular to the first and second surfaces of insulative substrate 22.

In the present embodiment, the openings of second penetrating hole (36a) and third penetrating hole (22b) are formed to be circular. However, they are not limited to being formed in such a way, and they may be formed to be oval.

In the present embodiment, laser processing is employed to bore second penetrating hole (36a) and third penetrating hole (22b). However, that is not the only method, and drilling may also be employed, for example. In addition, second penetrating hole (36a) is formed so that its central axis overlaps the central axis of first penetrating hole (22a).

Figure 5H:
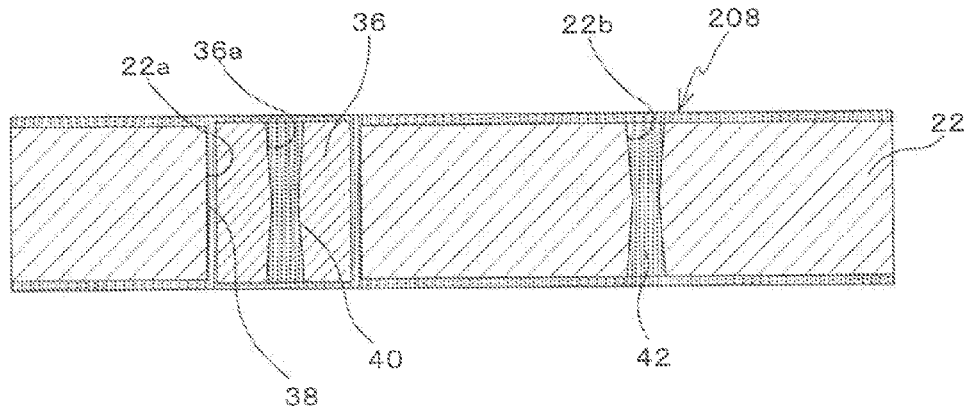

Next, as shown in FIG. 5H, electroless plating and electrolytic plating are performed to form plated film 208 made of copper, for example, in second penetrating hole (36a) and third penetrating hole (22b) and on the substrate surfaces. Here, on the surfaces of filler 36, conductive layers are formed, having a double-layer structure of electroless plated film and electrolytic plated film. Also, on the substrate surfaces excluding top surfaces of filler 36, conductive layers are formed, being made of copper foil (202a), electroless plated films (200a, 200c) and electrolytic plated films (200b, 200d) (see FIG. 4).

When the conductive layers are formed, plating is filled in second penetrating hole (36a) and third penetrating hole (22b) at the same time, forming inner through-hole conductor 40 and third through-hole conductor 42 respectively. Here, inner through-hole conductor 40 is formed with copper, but it may also be formed with nickel, conductive paste or the like. As described, inner through-hole conductor 40 and third through-hole conductor 42 are formed using the same procedure and the same material as those of the conductive layers.

Inner through-hole conductor 40 of the present embodiment is formed to have narrowed portion (40a) at the halfway point in the thickness of insulative substrate 22, and the diameter of the central portion is set smaller than the diameter of the top and bottom portions (see FIG. 2). However, inner through-hole conductor 40 is not limited to being formed as above, and its shape may be a truncated cone or a cylinder. Also, the central axis of inner through-hole conductor 40 substantially overlaps the central axis of first penetrating hole (22a).

Figure 5I:
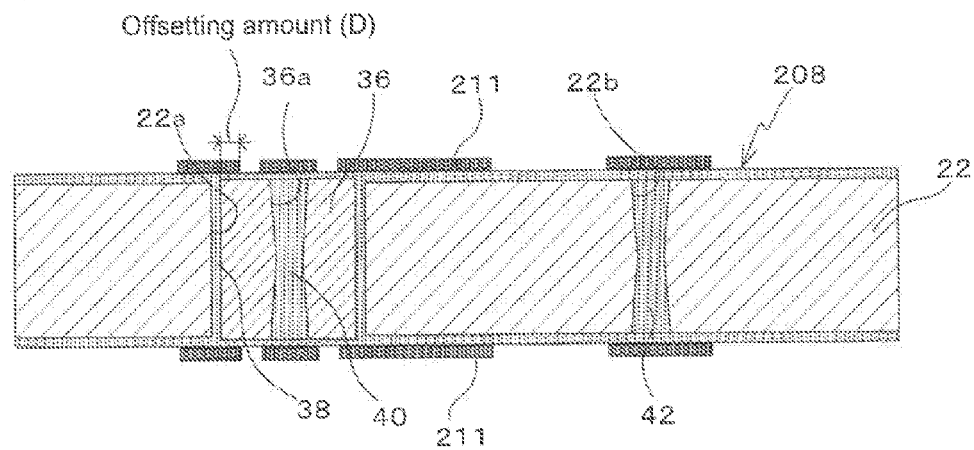
Figure 5J:
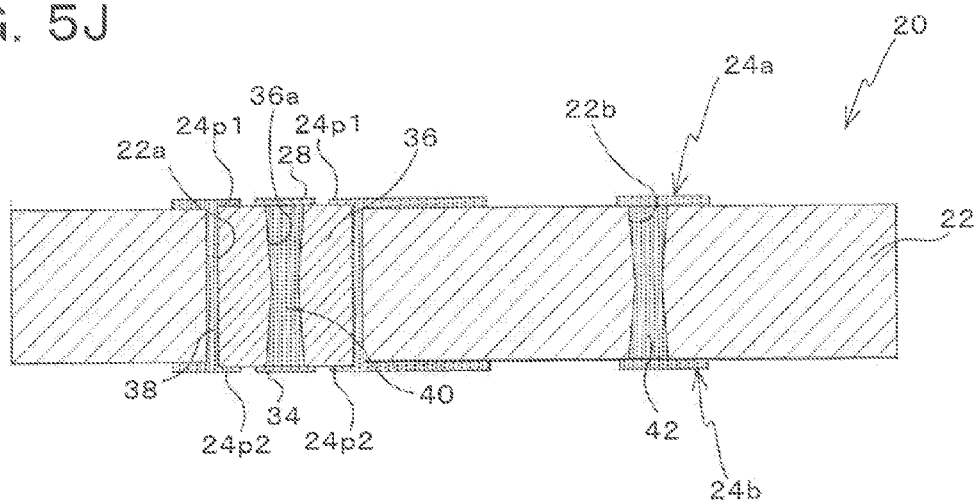

Next, the conductive layers are patterned by a tenting method, using etching resists 211 as shown in FIG. 5I. Namely, etching resist 211, having openings where patterns are not formed, are formed on the conductive layers. Then, the conductive layers exposed through such openings are etched. Accordingly, as shown in FIG. 5J, first conductive portion 28 and first conductive circuit (24a) as well as second conductive portion 34 and second conductive circuit (24b) are formed. As so described, first conductive portion 28 and first conductive circuit (24a) as well as second conductive portion 34 and second conductive circuit (24b) are formed in the same procedure.

In the step shown in FIG. 5I, etching resist 211 is formed so that it protrudes from the periphery of first penetrating hole (22a) toward the center of first penetrating hole (22a). In other words, etching resist 211 is formed to have a predetermined offsetting amount (D) from the periphery of first penetrating hole (22a) toward the center of first penetrating hole (22a).

During that time, the conductive layer positioned on the periphery of first penetrating hole (22a) is covered with etching resist 211.

Here, when the conductive layer is etched, the etching solution may seep underneath resist 211, thus etching the connected portion of outer through-hole conductor 38 and conductive circuit (24a). Accordingly, line breakage may occur. As described above, since the thickness of the conductive layer is relatively thick on the substrate surface excluding the top surface of filler 36, such a problem will be noticeable as the etching time increases.

Therefore, if etching resist 211 is formed to cover the periphery of first penetrating hole (22a) (the connected portion of outer through-hole conductor 38 and conductive circuit (24a)), the connected portion of conductive circuit (24a) and outer through-hole conductor 38 is not etched, and line breakage is prevented.

After that, if required, the surfaces of first and second conductive circuits (24a, 24b) and first and second conductive portions (28, 34) are roughened by etching, for example. Accordingly, adhesiveness is enhanced between first and second conductive circuits (24a, 24b) and insulation layers (72, 82) arranged as their upper layers (see FIG. 3). Core substrate 20 is obtained through the above procedures.

Forming Built-Up Layer 50 and Built-Up Layer 60

Figure 6A:
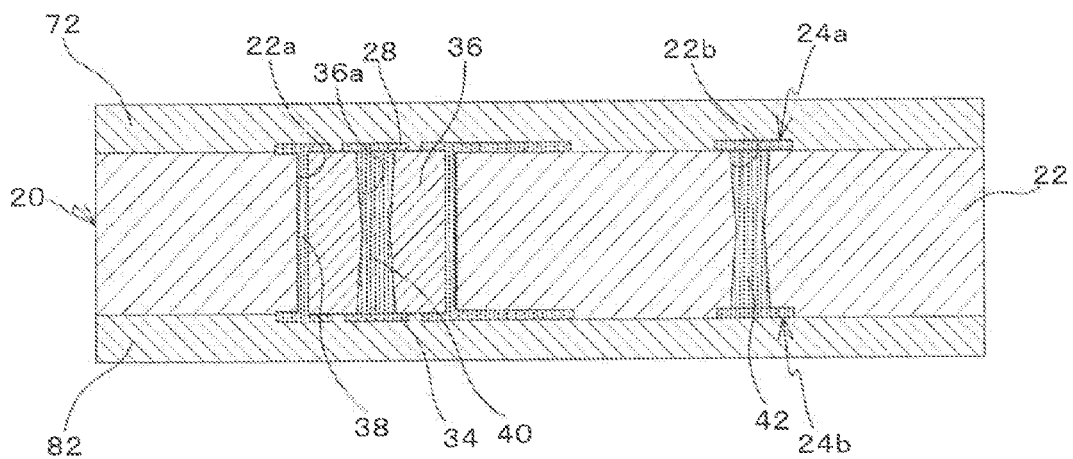

Next, as shown in FIG. 6A, by placing film-type thermosetting resin on the first and second surfaces of core substrate 20 and then thermal pressing the films, insulation layers (72, 82) are formed on the first and second surfaces of core substrate 20 respectively. Insulation layers (72, 82) may also be formed by coating liquid-type thermosetting resin using screen printing, curtain coating or the like.

Figure 6B:
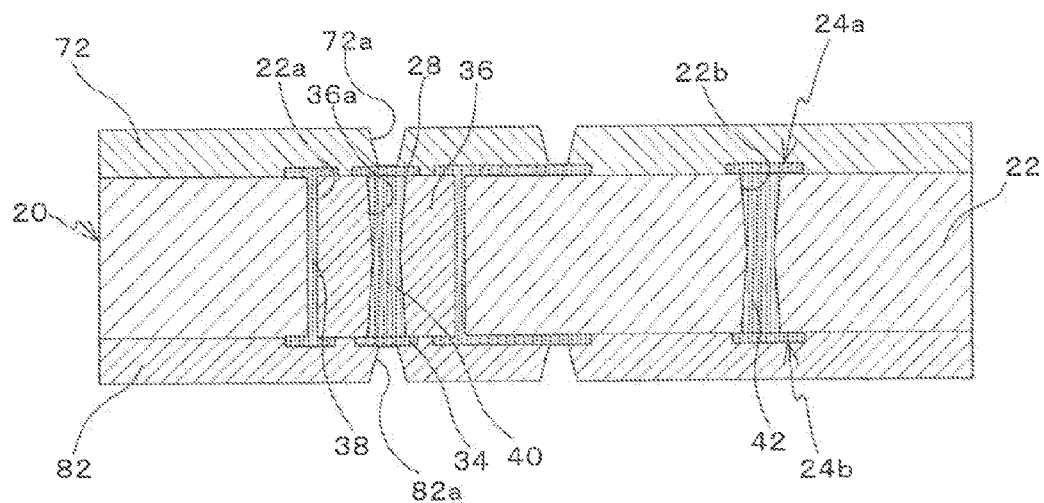

Then, as shown in FIG. 6B, via holes (72a, 82a) are bored in their respective insulation layers (72, 82) by using a laser. Here, via holes (72a, 82a) are bored so that their central axes overlap the central axis of inner through-hole conductor 40. Then, to remove smears and the like remaining at the bottom portions of via holes (72a, 82a), desmearing is conducted.

Next, as shown in FIGS. 6C-6F, wiring layer 74 including conductor (74a) and wiring layer 84 including conductor (84a) are formed on their respective insulation layers (72, 82) by using a semi-additive method.

Figure 6C:
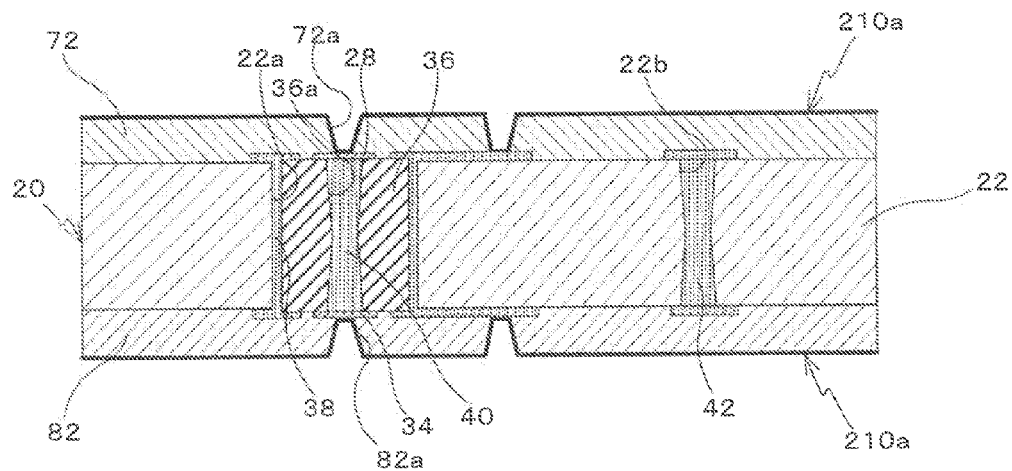

In particular, the laminate shown in FIG. 6B is immersed in a solution containing a catalyst such as palladium, for example. In doing so, the catalyst is adsorbed on the surfaces of insulation layers (72, 82). Then, as shown in FIG. 6C, the substrate with adsorbed catalyst is immersed in an electroless copper-plating solution to form electroless plated films (210a) on the surfaces of insulation layers (72, 82).

Figure 6D:
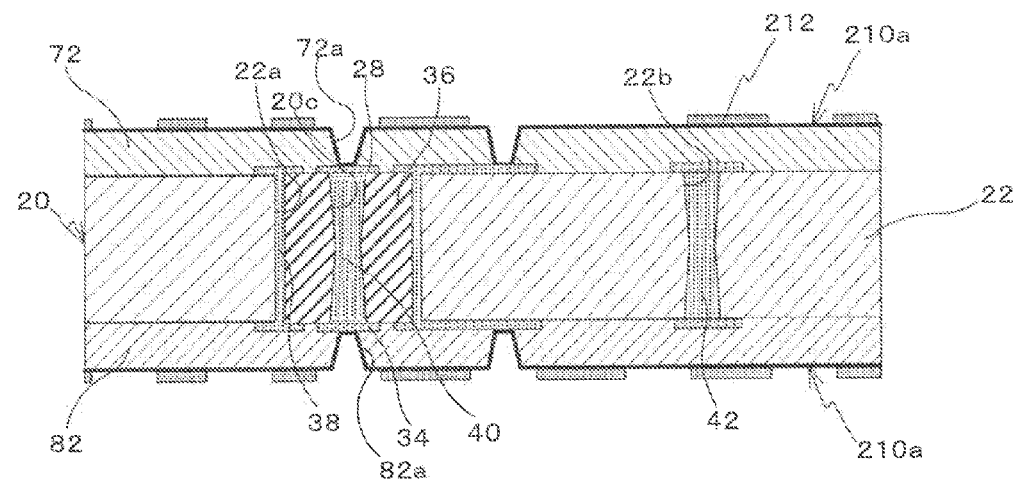

After that, a dry-film-type photosensitive resist is laminated on both surfaces of the laminate. Then, a mask film having a predetermined pattern is adhered to each photosensitive resist, which is then exposed to ultraviolet rays and developed in an alkaline solution. Accordingly, as shown in FIG. 6D, plating-resist layers 212 are formed, where only the regions on which conductors are formed later are opened.

Figure 6E:
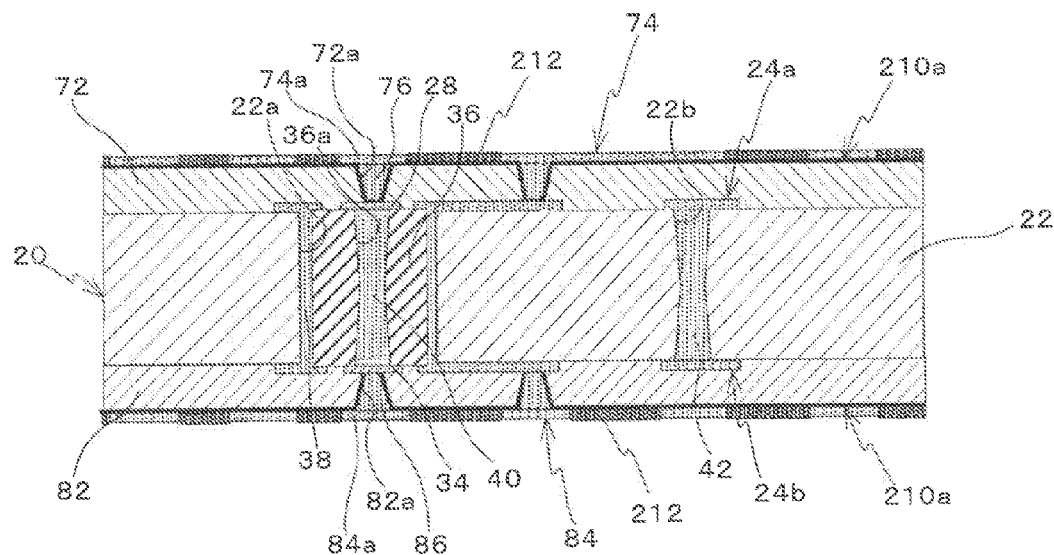

Next, after the laminate is washed with water and dried, electrolytic plating is performed using the electroless plated films as seed layers. Accordingly, as shown in FIG. 6E, wiring layer 74 having conductor (74a) and wiring layer 84 having conductor (84a) are formed by plating in their respective openings of plating-resist layers 212. During such time, via holes (72a, 82a) are filled with plating, and via conductors (76, 86) are formed respectively.

Via conductors (76, 86) are formed so that their central axes overlap the central axis of inner through-hole conductor 40.

Figure 6F:
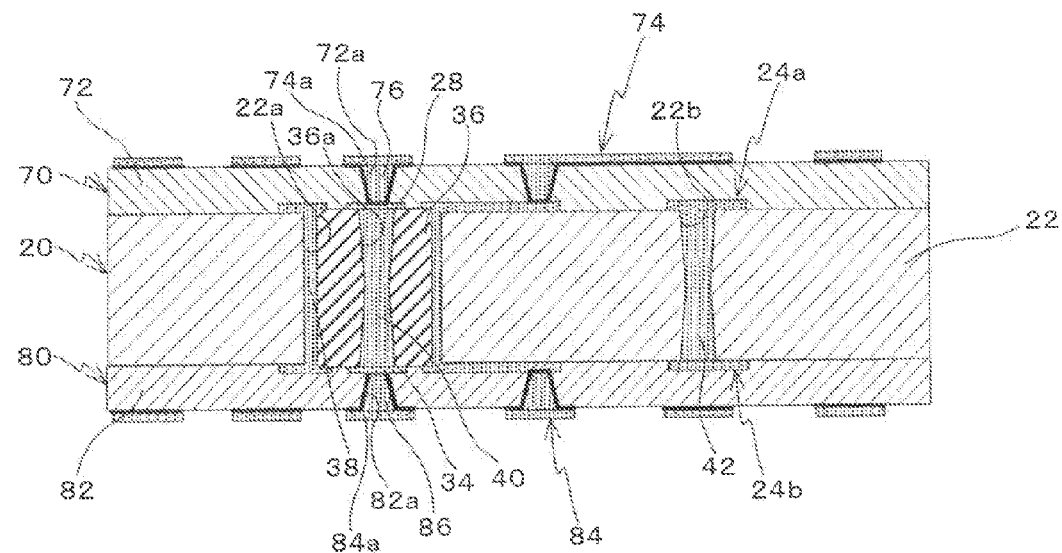

Next, plating-resist layers 212 are removed, and the substrate is washed with water and dried. Then, exposed electroless plated films (210a) are removed by etching. Accordingly, as shown in FIG. 6F, a laminate is obtained where first layers (70, 80) are respectively laminated on the upper and lower surfaces of core substrate 20.

Then, the steps shown in FIGS. 6C-6F are repeated and as shown in FIGS. 6G and 6H, second layers (90, 100) and third layers (110, 120) are formed in that order on the upper and lower surfaces of core substrate 20 respectively. Accordingly, a laminate is obtained where built-up layers (50, 60) are laminated on core substrate 20.

Forming Solder-Resist Layer 131 and Solder-Resist Layer 141

Figure 7A:
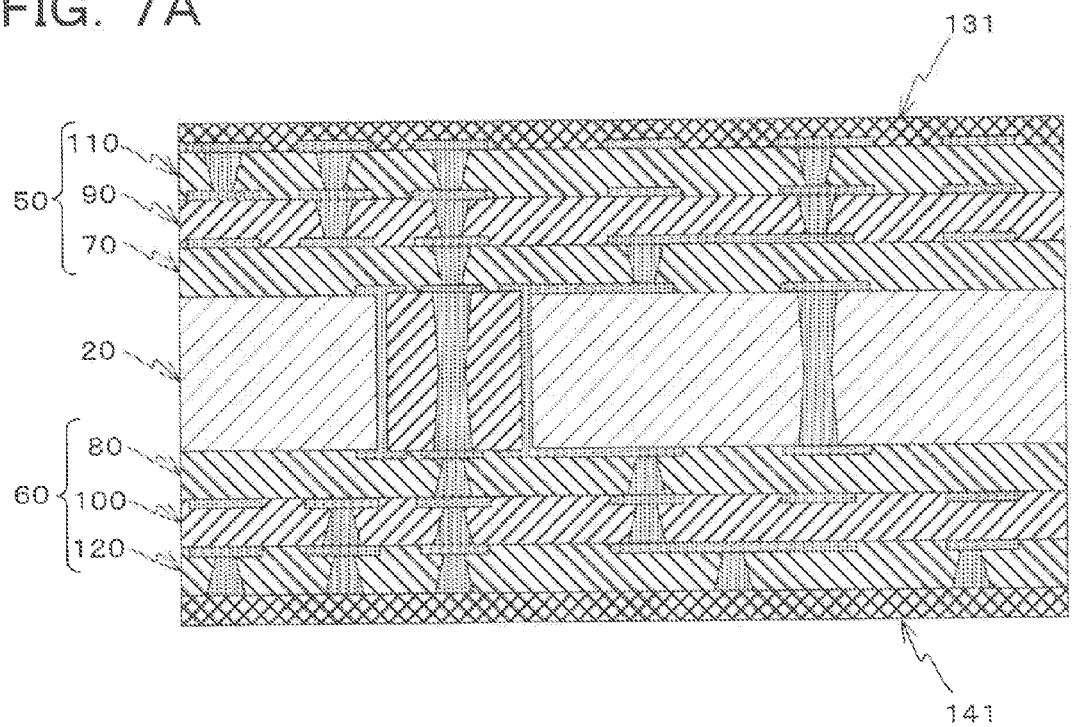
FIG. 7A is a view showing a step for forming solder-resist layers following the steps for forming built-up layers shown in FIGS. 6A-H.

Next, a liquid-type or a dry-film-type photosensitive resist (solder resist) is applied or laminated on both upper and lower surfaces of the laminate shown in FIG. 6H. Accordingly, solder-resist layers (131, 141) are formed on the upper and lower surfaces of the laminate as shown in FIG. 7A.

Figure 7B:
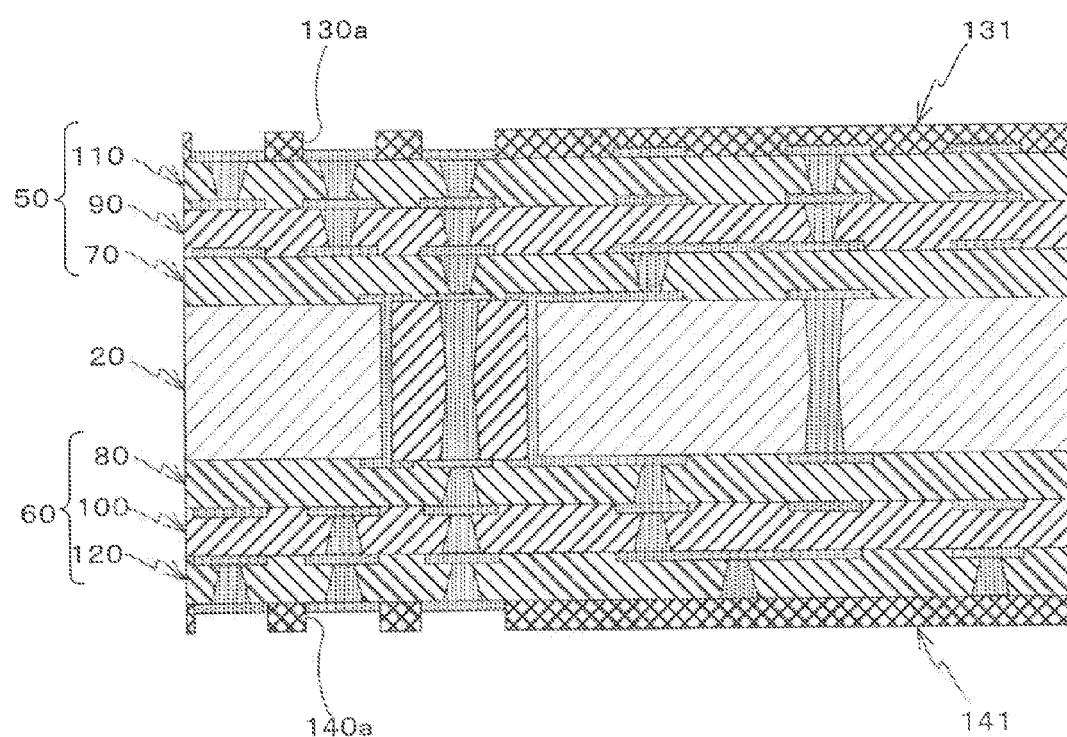
FIG. 7B is subsequent to FIG. 7A, a view showing a step for forming solder-resist layers.

Then, a photomask film with a conductive pattern (opening portions) is adhered on the surfaces of solder-resist layers (131, 141). Then, the films are exposed to ultraviolet rays and developed in an alkaline solution. In doing so, as shown in FIG. 7B, opening portions (130a, 140a) are formed in solder-resist layers (131, 141). Such opening portions (130a, 140a) are made to expose portions which become solder pads in wiring layers (114, 124).

Surface Treatment

Figure 8A:
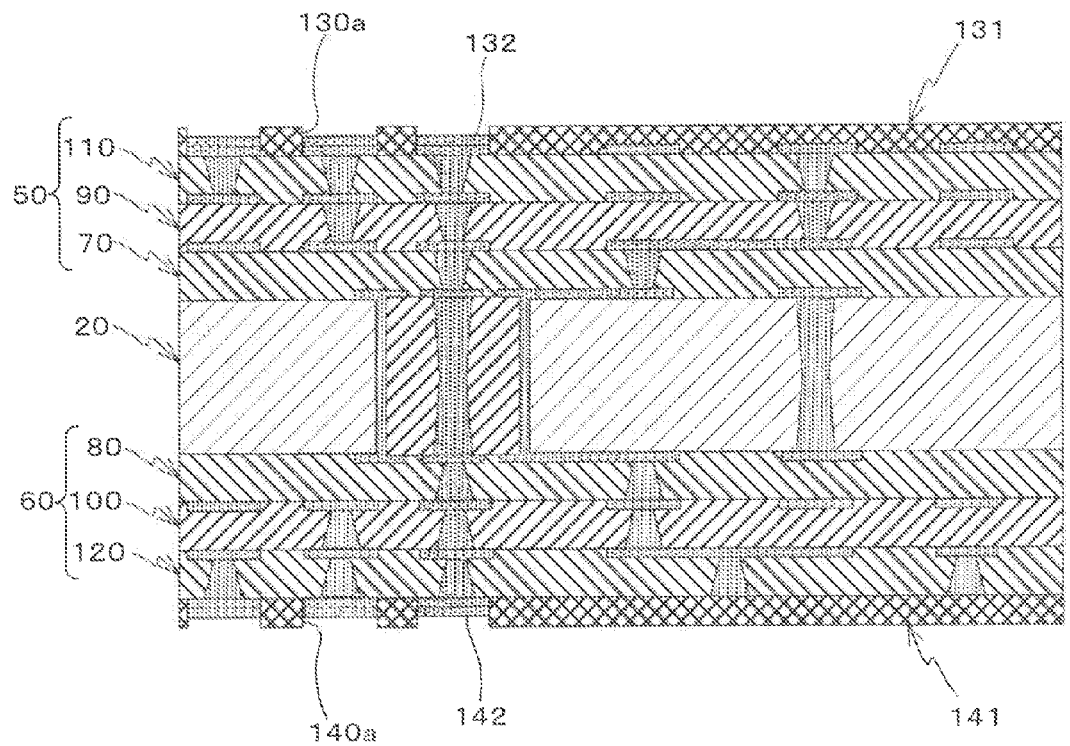
FIG. 8A is a view showing a step for surface treatment, following the steps for forming built-up layers shown in FIGS. 7A and 7B.

Next, as shown in FIG. 8A, solder connection layers (132, 142) are formed in opening portions (130a, 140a) respectively. Solder connection layers (132, 142) are plated layers to enhance the solderability of solder pads, and they are formed with a nickel-plated layer and a gold-plated layer.

The nickel-plated layer is formed by immersing the laminate in an electroless nickel-plating solution, and the gold-plated layer is formed by immersing the laminate in an electroless gold-plating solution. Here, solder connection layers (132, 142) may also be formed as triple layers such as nickel-palladium-gold plated layers. Alternatively, solder connection layers (132, 142) may be formed as single-plated layers using gold, silver or tin. They may also be formed with resin films such as flux.

Figure 8B:
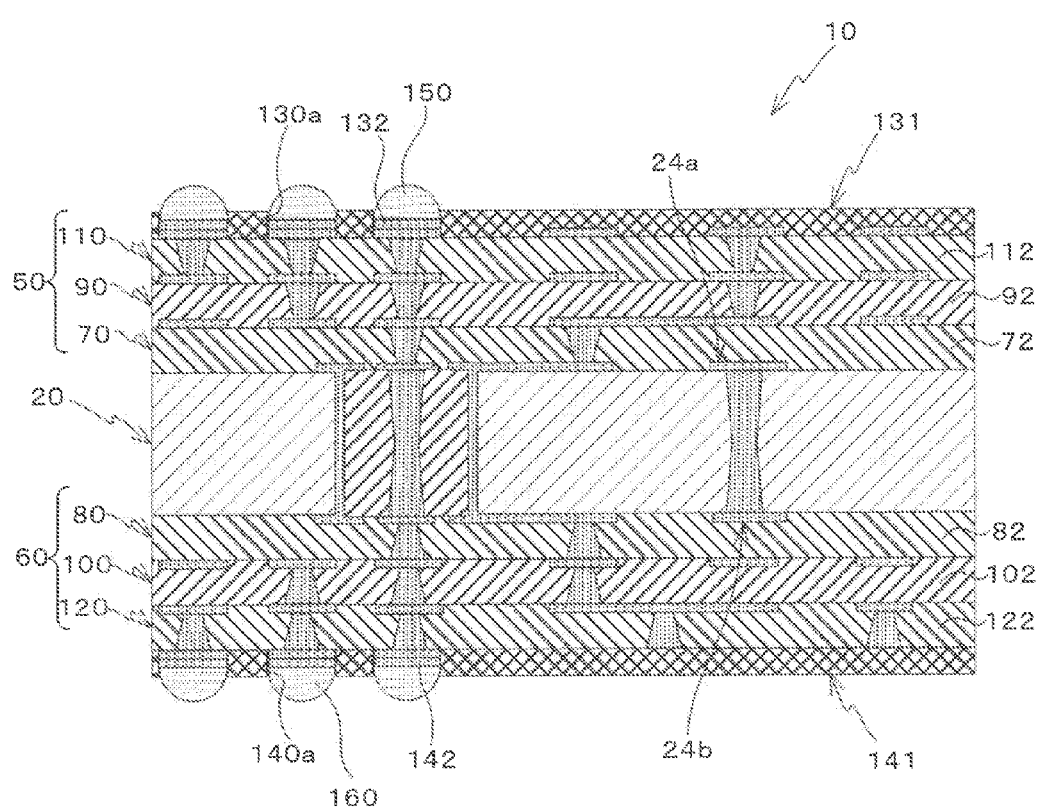
FIG. 8B is subsequent to FIG. 8A, a view showing a step for surface treatment.

Next, as shown in FIG. 8B, solder paste is printed on solder connection layers (132, 142) and reflowed. Accordingly, external connection terminals (150, 160) are formed. Through the above procedures, wiring board 10 is manufactured.

In the present embodiment, the direction of electric current in outer through-hole conductor 38 is set different from the direction of electric current in inner through-hole conductor 40. Accordingly, part of the magnetic flux generated by the electric current flowing through outer through-hole conductor 38 and part of the magnetic flux generated by the electric current flowing through inner through-hole conductor 40 are offset by each other. Therefore, transmission line impedance decreases, and malfunctions or operational delays are suppressed from occurring in the CPU or MPU.

In addition, since transmission line impedance decreases, voltage losses are reduced. Thus, it is not required that a chip capacitor for a supply of constant voltage be inserted into the transmission line. As a result, manufacturing costs are reduced.

In the present embodiment, first conductive portion 28 and first conductive circuit (24a) are positioned on substantially the same plane. Also, second conductive portion 34 and second conductive circuit (24b) are positioned on substantially the same plane. Accordingly, the length of second penetrating hole (36a) in the thickness direction of wiring board 10 becomes shorter than its conventional counterpart. In other words, the aspect ratio (depth/diameter) of second penetrating hole (36a) becomes smaller. Thus, when filling inner through-hole conductor 40 with plating, the results are improved. Accordingly, voids are suppressed from occurring in inner through-hole conductor 40.

A wiring board according to the present invention is not limited to the above embodiment, and various modifications may be made within a scope that does not deviate from the gist of the present invention.

For example, the quality, size, the number of layers and so forth of each layer may be modified freely in the above embodiment.

Also, in wiring board 10 of the above embodiment, built-up layers (50, 60) formed on both surfaces of core substrate 20 are formed to have a triple-layer structure, respectively having first layer 70, second layer 90 and third layer 110 and first layer 80, second layer 100 and third layer 120. However, built-up layers are not limited to such, and they may be formed to have a single-layer structure, a double-layer structure or a structure with four or more layers. Alternatively, the number of layers that form built-up layers (50, 60) may be different from each other. Yet alternatively, such a built-up layer may be formed only on one main surface of either side. Moreover, external connection terminals for connection with an electronic component may only be formed on either main surface of a wiring board.

In wiring board 10 according to the above embodiment, first and second conductive portions (28, 34) are set as lands. However, such conductive portions may also be set as via conductors (76, 86). In such a case, lands do not exist, and via conductors (76, 86) are directly connected to inner through-hole conductor 40.

Also, first and second conductive circuits (24a, 24b) may be set to have substantially the same thickness as first and second conductive portions (28, 34). Alternatively, they may be set thinner than first and second conductive portions (28, 34). In such a case, for example, it is an option to reduce the thickness by etching conductive layers which form first and second conductive circuits (24a, 24b) after plated films 208 are formed.

A wiring board according to one aspect of the present invention has the following: a substrate having a first surface and a second surface and a first penetrating hole; a first conductive circuit formed on the first surface of the substrate; a second conductive circuit formed on the second surface of the substrate; a first through-hole conductor formed on the inner wall of the first penetrating hole and connecting the first conductive circuit and the second conductive circuit; a filler filled inside the first through-hole conductor and having a second penetrating hole; a first conductive portion formed on one side of the filler; a second conductive portion formed on the other side of the filler; and a second through-hole conductor formed in the second penetrating hole and connecting the first conductive portion and the second conductive portion. In such a wiring board, the second through-hole conductor is formed with plating filled in the second penetrating hole.

A method for manufacturing a wiring board according to another aspect of the present invention includes the following: forming a first penetrating hole in a substrate having a first surface and a second surface; forming a first through-hole conductor on the inner wall of the first penetrating hole; on the first surface and the second surface of the substrate, forming conductive circuits to be connected by the first through-hole conductor; filling a filler inside the first through-hole conductor; forming a second penetrating hole in the filler; by filling a conductive material in the second penetrating hole, forming a second through-hole conductor; and on one side and on the other side of the filler, forming conductive portions to be connected by the second through-hole conductor. In such a method, the second through-hole conductor is formed by filling plating in the second penetrating hole.

The steps for manufacturing a wiring board described in the above embodiment may be modified properly within a scope that does not deviate from the gist of the present invention. In addition, some processes may be omitted according to usage requirements or the like. For example, conductive patterns of wiring layers may be formed by a semi-additive method, subtractive method, or any other method.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a substrate having a first surface and a second surface on an opposite side of the first surface, the substrate having a first penetrating hole penetrating through the substrate between the first surface and the second surface, a first through-hole conductor formed on an inner wall of the first penetrating hole, a filler filled inside the first through-hole conductor and forming a second penetrating hole, and a second through-hole conductor formed in the second penetrating hole;
   a first conductive circuit formed on the first surface of the substrate and comprising a metal foil layer laminated on the first surface of the substrate;
   a second conductive circuit formed on the second surface of the substrate and comprising a metal foil layer laminated on the second surface of the substrate;
   a first conductive portion formed on one end of the second penetrating hole; and
   a second conductive portion formed on an opposite end of the second penetrating hole,
   wherein the first through-hole conductor is connecting the first conductive circuit and the second conductive circuit, the second through-hole conductor comprises a conductive material filled in the second penetrating hole and is connecting the first conductive portion and the second conductive portion, the first and second conductive portions integrally include the conductive material of the second penetrating hole, the first conductive circuit has a protruding portion protruding from a periphery portion of the first penetrating hole toward the second penetrating hole, and the first conductive circuit has a thickness which is greater than a thickness of the protruding portion of the first conductive circuit and a thickness of the first conductive portion.

2. The wiring board according to claim 1, wherein the conductive material is made of a plating.

3. The wiring board according to claim 1, wherein the substrate comprises a resin.

4. The wiring board according to claim 1, wherein the filler is made of a resin.

5. The wiring board according to claim 1, wherein the first through-hole conductor and the second through-hole conductor are circuited such that a direction of electric current in the first through-hole conductor is different from a direction of electric current in the second through-hole conductor.

6. The wiring board according to claim 1, wherein the second penetrating hole is formed by conducting laser irradiation.

7. The wiring board according to claim 1, wherein the first through-hole conductor and the second through-hole conductor are power-supply through-hole conductors.

8. The wiring board according to claim 1, wherein the thickness of the protruding portion of the first conductive circuit is equal to the thickness of the first conductive portion.

9. The wiring board according to claim 1, wherein the first conductive circuit comprises a first electroless plated layer, a first electrolytic plated layer, a second electroless plated layer and a second electrolytic plated layer formed on the metal foil layer of the first conductive circuit, the second conductive circuit comprises a first electroless plated layer, a first electrolytic plated layer, a second electroless plated layer and a second electrolytic plated layer formed on the metal foil layer of the second conductive circuit, the first conductive portion formed on the one end of the second penetrating hole comprises an electroless plated layer and an electrolytic plated layer, the second conductive portion formed on the opposite end of the second penetrating hole comprises an electroless plated layer and an electrolytic plated layer, and the conductive material of the second through-hole conductor comprises an electrolytic plated metal forming the electrolytic plated layers of the first and second conductive portions.

10. The wiring board according to claim 9, wherein the protruding portion comprises the second electroless plated layer of the first conductive circuit and the second electrolytic plated layer of the first conductive circuit.

11. The wiring board according to claim 9, wherein the second conductive circuit has a second protruding portion protruding from the periphery portion of the first penetrating hole toward the second penetrating hole, the protruding portion comprises the second electroless plated layer of the first conductive circuit and the second electrolytic plated layer of the first conductive circuit, and the second protruding portion comprises the second electroless plated layer of the second conductive circuit and the second electrolytic plated layer of the second conductive circuit.

12. The wiring board according to claim 9, wherein the metal foil layers of the first and second conductive circuits are copper foils, respectively, the first electroless plated layers of the first and second conductive circuits are electroless plated copper layers, the first electrolytic plated layers of the first and second conductive circuits are electrolytic plated copper layers, the second electroless plated layers of the first and second conductive circuits are electroless plated copper layers, and the second electrolytic plated layers of the first and second conductive circuits are electrolytic plated copper layers.

* * * * *